United States Patent
Wang et al.

(10) Patent No.: US 10,204,974 B2
(45) Date of Patent: Feb. 12, 2019

(54) PIXEL CIRCUIT, DISPLAY SUBSTRATE, DISPLAY DEVICE, AND METHOD FOR DRIVING DISPLAY SUBSTRATE

(71) Applicants: BOE TECHNOLOGY GROUP CO., LTD., Beijing (CN); ORDOS YUANSHENG OPTOELECTRONICS CO., LTD., Ordos (CN)

(72) Inventors: Qiang Wang, Beijing (CN); Libin Liu, Beijing (CN)

( * ) Notice: Subject to any disclaimer, the term of this patent is extended or adjusted under 35 U.S.C. 154(b) by 205 days.

(21) Appl. No.: 15/233,443

(22) Filed: Aug. 10, 2016

(65) Prior Publication Data
US 2017/0193901 A1     Jul. 6, 2017

(30) Foreign Application Priority Data
Jan. 6, 2016   (CN) .......................... 2016 1 0007170

(51) Int. Cl.
*G09G 3/30*      (2006.01)
*H01L 27/32*     (2006.01)
(Continued)

(52) U.S. Cl.
CPC ....... *H01L 27/3276* (2013.01); *G09G 3/3233* (2013.01); *G09G 2300/0814* (2013.01); *G09G 2300/0819* (2013.01); *G09G 2300/0823* (2013.01); *G09G 2300/0842* (2013.01); *G09G 2300/0861* (2013.01); *G09G 2310/0245* (2013.01); *G09G 2310/08* (2013.01); *G09G 2320/043* (2013.01); *G09G 2330/12* (2013.01); *H01L 27/124* (2013.01); *H01L 27/1255* (2013.01)

(58) Field of Classification Search
CPC .. G09G 3/3208; G09G 3/3225; G09G 3/3233; G09G 3/3258
USPC ....................................... 345/76–81
See application file for complete search history.

(56) References Cited

U.S. PATENT DOCUMENTS

2010/0123649 A1   5/2010   Hamer et al.
2010/0164847 A1*  7/2010   Lee ..................... G09G 3/3233
                                                     345/77

(Continued)

FOREIGN PATENT DOCUMENTS

CN   101339737 A   1/2009
CN   102257555 A   11/2011
(Continued)

OTHER PUBLICATIONS

First Office Action regarding Chinese Application No. 201610007170. 1, dated Jun. 2, 2017. Translation provided by Dragon Intellectual Property Law Firm.
(Continued)

*Primary Examiner* — Roy P Rabindranath

(57) ABSTRACT

The present disclosure relates to a pixel circuit, a display substrate, a display device, and a method for driving the display substrate. The pixel circuit includes an offset control unit, which is connected between a reset control terminal and a first end of an electroluminescent unit and is configured to be turned on in a case that a reset control signal is applied to the reset control terminal, and to set a voltage of the first end of the electroluminescent unit to be a voltage of the reset control signal.

20 Claims, 7 Drawing Sheets

(51) Int. Cl.
*G09G 3/3233* (2016.01)
*H01L 27/12* (2006.01)

(56) References Cited

U.S. PATENT DOCUMENTS

| | | | |
|---|---|---|---|
| 2012/0162176 A1* | 6/2012 | Kim | G09G 3/3258 |
| | | | 345/211 |
| 2013/0043802 A1 | 2/2013 | Han et al. | |
| 2013/0057521 A1* | 3/2013 | Kim | H01L 27/3216 |
| | | | 345/204 |
| 2014/0198085 A1 | 7/2014 | Park et al. | |
| 2015/0154913 A1 | 6/2015 | Kim | |

FOREIGN PATENT DOCUMENTS

| | | |
|---|---|---|
| CN | 102956192 A | 3/2013 |
| CN | 103943063 A | 7/2014 |
| KR | 20150065026 A | 6/2015 |

OTHER PUBLICATIONS

Second Office Action regarding Chinese Application No. 201610007170.1, dated Dec. 6, 2017. Translation provided by Dragon Intellectual Property Law Firm.

* cited by examiner

PIXEL CIRCUIT, DISPLAY SUBSTRATE, DISPLAY DEVICE, AND METHOD FOR DRIVING DISPLAY SUBSTRATE

CROSS-REFERENCE TO RELATED APPLICATION

The present disclosure claims a priority to Chinese Patent Application No. 201610007170.1 filed in China on Jan. 6, 2016, the disclosures of which are incorporated in their entirety by reference herein.

TECHNICAL FIELD

The present disclosure relates to the field of display technique, in particular to a pixel circuit, a display substrate, a display device and a method for driving the display substrate.

BACKGROUND

An Organic Light Emitting Diode (OLED) display is one of hot topics in a research field of a flat panel display. Compared with a Liquid Crystal Display (LCD), the Organic Light Emitting Diode display has advantages of low power consumption, low product costs, self-illumination, broad angles of view, fast response, and so on. Currently, in display devices such as a mobile phone, a Personal Digital Assistant (PDA), a digital camera and the like, the OLED display has gradually replaced the conventional LCD.

A key structure for driving a pixel in the OLED display is a pixel circuit, which includes an OLED and a display driving unit for driving the OLED. The display driving unit is connected with one electrode (anode or cathode) of the OLED. By applying currents having different amplitudes to the electrode, the OLED is caused to display different brightness. Typically, a polarity of the current applied to the OLED by the display driving unit is unchanged, causing the OLED to be offset uni-directionally (in a forward direction or in a backward direction) in long term, and therefore a service life of the OLED is shortened.

SUMMARY

The purpose of the present disclosure is to solve the above mentioned technical problem.

In a first aspect, the present disclosure provides a pixel circuit including an electroluminescent unit, a display driving unit, and an offset control unit, and further including a reset control terminal and an initial voltage input terminal.

The display driving unit is connected to the reset control terminal, the initial voltage input terminal, a first node, and a first end of the electroluminescent unit and is configured to generate a current having a corresponding amplitude according to a voltage at the first node and to input the current to the first end of the electroluminescent unit, and to set a voltage at the first node to be an initial voltage of the initial voltage input terminal in response to a reset control signal inputted at the reset control terminal.

The offset control unit is connected to the reset control terminal and the first end of the electroluminescent unit, and configured to be turned on in a case that the reset control signal is inputted at the reset control terminal, so as to set the voltage at the first end of the electroluminescent unit to be a voltage of the reset control signal.

Further, the offset control unit is configured to be turned on in a case that the reset control terminal is at a low voltage level, and the current generated by the display driving unit is a positive current.

Still further, the offset control unit includes a first transistor of a P-type, one of a source electrode and a drain electrode of the first transistor is connected to the first end of the electroluminescent unit, a gate electrode and the other one of the source electrode and the drain electrode of the first transistor is connected to the reset control terminal.

Still further, the pixel circuit further includes a light-emitting control terminal, wherein the display driving unit is further connected to the light-emitting control terminal, and configured to generate the current having the corresponding amplitude according to the voltage at the first node and input the current to the first end of the electroluminescent unit in a case that a light-emitting control signal is inputted to the light-emitting control terminal.

Still further, the pixel circuit further includes a data voltage input terminal, an operation voltage input terminal, a direct-current low voltage input terminal, and a writing and compensating control terminal, and the display driving unit includes a second transistor, a third transistor, a fourth transistor, a fifth transistor, a sixth transistor, and a seven transistor which are all of P-type, and includes a capacitor. A gate electrode of the second transistor is connected to the writing and compensating control terminal, one of a source electrode and a drain electrode of the second transistor is connected to the first node, and the other one of the source electrode and the drain electrode of the second transistor is connected to a third node. A gate electrode of the third transistor is connected to the first node, one of a source electrode and a drain electrode of the third transistor is connected to a second node, and the other one of the source electrode and the drain electrode of the third transistor is connected to the third node. A gate electrode of the fourth transistor is connected to the writing and compensating control terminal, one of a source electrode and a drain electrode of the fourth transistor is connected to the data voltage input terminal, and the other one of the source electrode and the drain electrode of the fourth transistor is connected to the second node. Both a gate electrode of the fifth transistor and a gate electrode of the sixth transistor are connected to the light-emitting control terminal, one of a source electrode and a drain electrode of the fifth transistor is connected to the operation voltage input terminal, and the other one of the source electrode and the drain electrode of the fifth transistor is connected to the second node, and one of a source electrode and a drain electrode of the sixth transistor is connected to the first end of the electroluminescent unit, and the other one of the source electrode and the drain electrode of the sixth transistor is connected to the third node. A gate electrode of the seventh transistor is connected to the reset control terminal, one of a source electrode and a drain electrode of the seventh transistor is connected to the initial voltage input terminal, and the other one of the source electrode and the drain electrode of the seventh transistor is connected to the first node. One end of a capacitor is connected to the first node, and the other end of the capacitor is connected to the operation voltage input terminal. A voltage level of the light-emitting control signal is low.

In a second aspect, the present disclosure provides a display substrate including a base and a plurality of pixel circuits arranged on the base, wherein each of the plurality of pixel circuits includes any of the pixel circuits described above.

Further, on condition that the pixel circuit further includes the light-emitting control terminal, the display substrate further includes a first test wire and a second test wire, wherein the first test wire is connected to the reset control terminals of the pixel circuits in each row, and the second test wire is connected to the light-emitting control terminals of the pixel circuits in each row.

Still further, on condition that the pixel circuits further include the light-emitting control terminals, the display substrate furthers includes a first scan driving circuit, a second scan driving circuit, a first test wire, a second test wire, a test switch array, and a plurality of test control wires for controlling the test switch array, wherein the first scan driving circuit is configured to output the reset control signals to the reset control terminals of the pixel circuits row by row, and the second scan driving circuit is configured to output the light-emitting control signals to the light-emitting control terminals of the pixel circuits row by row. The test switch array is connected to the first test wire, the second test wire, and a plurality of test control wires, and is configured to, in a display stage, in response to display control signals applied to the plurality of test control wires, disconnect the reset control terminal of each pixel circuit from the first test wire, disconnect the light-emitting control terminal of each pixel circuit from the second test wire, and connect the reset control terminal of each pixel circuit with the first scan driving circuit, and to, in a test stage, in response to test control signals applied to the plurality of test control wires, connect the reset control terminal of each pixel circuit with the first test wire, connect the light-emitting control terminal of each pixel circuit with the second test wire, and disconnect the reset control terminal of each pixel circuit with the first scan driving circuit.

Still further, the test switch array includes a plurality of first test switches, a plurality of second test switches, and a plurality of third test switches. The pixel circuits in each row correspond to one of the plurality of the first test switches, one of the plurality of the second test switches, and one of the plurality of the third test switches. The one of the plurality of the first test switches is connected between the light-emitting control terminals of the pixel circuits in the row and the second test wire, the one of the plurality of the second test switches is connected between the first scan driving circuit and the reset control terminals of the pixel circuits in the row, and the one of the plurality of the third test switches is connected between the reset control terminals of the pixel circuits in the row and the first test wire.

In the third aspect, the present disclosure further provides a method for driving any of the display substrates described above, including: in a reverse offset stage included in a display stage, outputting the reset control signal to the reset control terminal of each pixel circuit row by row, wherein an absolute value of the voltage of the reset control signal is larger than that of the initial voltage inputted at the initial voltage input terminal.

Further, on condition that the display substrate also includes a first test wire and a second test wire, the method further includes, in the test stage, applying a light emission driving voltage to the first test wire, and applying a voltage having a reverse level compared to a level of the light-emitting control signal to the second test wire.

Still further, on condition that the display substrate also includes the first scan driving circuit, the second scan driving circuit, the first test wire, the second test wire, the test switch array and the plurality of test control wires for controlling the test switch array, the method further includes: in the display stage, applying display control signals to the plurality of test control wires; and in a test stage, applying test control signals to the plurality of test control wires, and applying a light emission driving voltage to the first test wire, and applying a voltage having a reverse level compared to a level of the light-emitting control signal to the second test wire; the light emission driving voltage is adapted to turn the various offset control units on and cause the various pixel circuits to emit light.

In a fourth aspect, the present disclosure further provides a display device including any of the display substrates described above.

An offset control unit is included in the pixel circuits provided in the present disclosure. The offset control unit is connected to the reset control terminal and the first end of the electroluminescent unit and is configured to be turned on when the reset control signal is applied to the reset control terminal, so as to set the voltage of the first end of the electroluminescent unit to be the voltage of the reset control signal. Therefore, by providing a corresponding reversely-offset voltage to the reset control terminal, the present disclosure can implement a reverse offset of the electroluminescent unit, thereby extending the service life of the electroluminescent unit. Additionally, because the present disclosure provides the reverse offset of the electroluminescent unit according to the voltage inputted to the reset control terminal, such is not affected by other voltages (such as the initial voltage), and by reversely offsetting the electroluminescent unit stronger using the reverse offset voltage having a larger absolute value, the service life of the electroluminescent unit can be extended longer.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
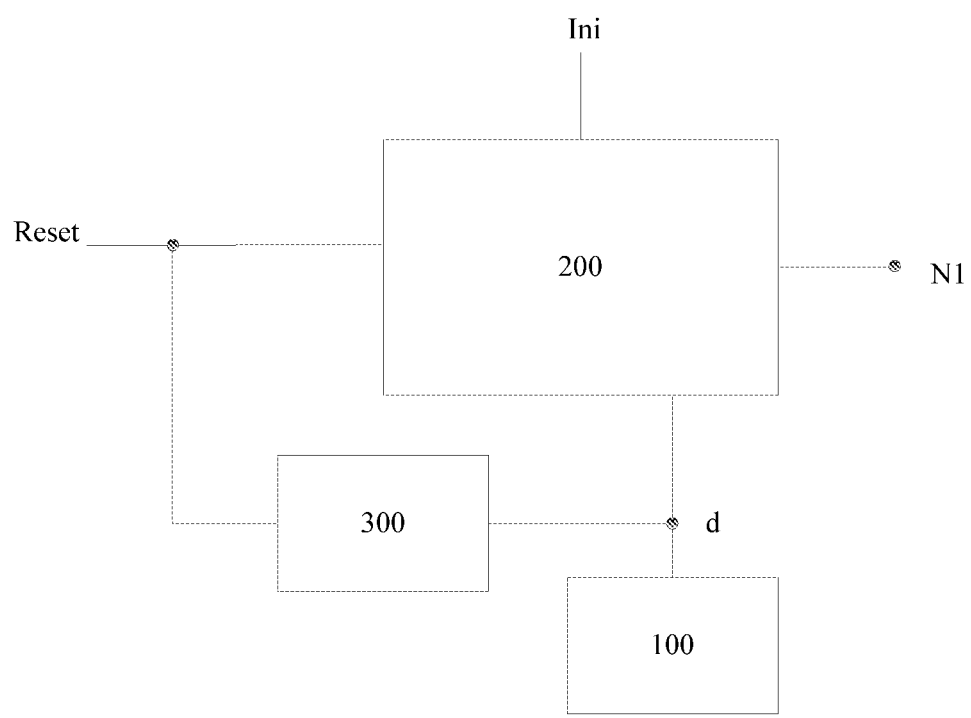
FIG. 1 is a structural schematic diagram of a pixel circuit according to the embodiments of the present disclosure.

In an aspect, the present disclosure provides a pixel circuit. Referring to FIG. 1, the pixel circuit includes an electroluminescent unit 100, a display driving unit 200, and an offset control unit 300, and has a reset control terminal Reset and an initial voltage input terminal Ini. The display driving unit 200 is connected to the reset control terminal Reset, the initial voltage input terminal Ini, a first node N1, and a first end of the electroluminescent unit 100, and is adapted to generate currents having corresponding amplitudes according to the voltage at the first node N1, to input the current to the first end (referred as 'd' in FIG. 1) of the electroluminescent unit 100, and to set the voltage of the first node N1 to an initial voltage of the initial voltage input terminal Ini in response to a reset control signal inputted to the reset control terminal Reset. The offset control unit 300 is connected to the reset control terminal Reset and the first end of the electroluminescent unit 100, and is adapted to be turned on when the reset control signal is inputted to the reset control terminal Reset, thereby setting the voltage of the first end of the electroluminescent unit 100 as the voltage of the reset control signal.

The offset control unit in the pixel circuit according to the embodiments of the present disclosure is connected to the reset control terminal and the first end of the electroluminescent unit, and is adapted to be turned on when the reset control signal is inputted to the reset control terminal and thereby setting the voltage of the first end of the electroluminescent unit as the voltage of the reset control signal. In this way, a reverse offset of the electroluminescent unit can be implemented by applying a corresponding reverse offset voltage to the reset control terminal, thereby extending the service life of the electroluminescent unit. Further, because in the present disclosure, the electroluminescent unit is reversely offset according to the voltage inputted to the reset control terminal, thus not being restricted by other voltages (such as the initial voltage, which cannot be too low in actual applications, because if the initial voltage is too low, the initial voltage will affect writing and compensating a data voltage at the first node), and by using a reverse offset voltage having a larger absolute value to more reversely offset the electroluminescent unit, the service life of the electroluminescent unit can be extended longer.

In another aspect, the present disclosure provides a display substrate and a method for driving the display substrate. The display substrate includes a base and a plurality of pixel circuits arranged on the base; each of the pixel circuits is that as described in the first aspect. The method for driving the display substrate includes a display stage which includes a revere offset stage. In the reverse offset stage, a reset control signal is outputted to the reset control terminals of the pixel circuits row by row; the absolute value of voltage of the reset control signal is larger than that of the initial voltage inputted to the initial voltage input terminal.

By using the driving method according to the embodiments of the present disclosure, the reverse offset of the electroluminescent unit in each of the pixel circuits of the display substrate can be implemented, thereby extending the service life of the electroluminescent unit. Additionally, in this method, because the absolute value of the voltage of the reset control signal is larger than the absolute values of the initial voltage inputted to the initial voltage input terminal, the electroluminescent unit can be more reversely offset compared with using the initial voltage for reversely offsetting.

In specific implementations, specific structures of the pixel circuit and the display substrate can take different forms, and specific methods for driving corresponding different structures may also have certain difference. Detailed description will be given hereinafter in combination with some exemplary structures.

Figure 2:
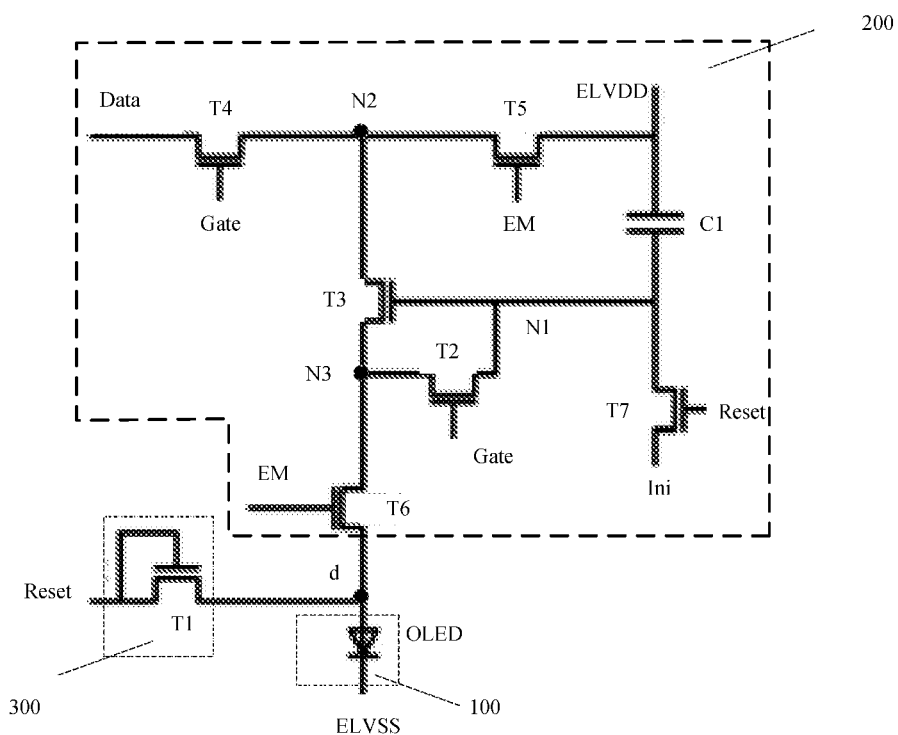
FIG. 2 is a circuitry diagram of a pixel circuit according to the embodiments of the present disclosure.

Referring to FIG. 2, which is a schematic diagram of a representative circuit structure of a pixel circuit according to the embodiments of the present disclosure. The pixel circuit includes seven P-type transistors T1, T2, T3, T4, T5, T6, T7, one capacitor C1, and one OLED, and has a reset control terminal Reset, an initial voltage input terminal Ini, a data voltage input terminal Data, an operation voltage input terminal ELVDD, a direction-current (DC) low voltage input terminal ELVSS, a writing and compensating control terminal Gate, and a light-emitting control terminal EM. The transistor T1 forms a reset control terminal 300, and both source electrode and gate electrode of the transistor T1 are connected to the reset control terminal Reset, and the drain electrode of the transistor T1 is connected to the anode of the OLED; the transistors T2, T3, T4, T5, T6, and T7 together form a display driving unit 200, wherein the source electrode of the transistor T2 is connected to the first node N1, the drain electrode of the transistor T2 is connected to the a third node N3, and the gate electrode of the transistor T2 is connected to the writing and compensating control terminal Gate; the source electrode of the transistor T3 is connected to a second node N2, the drain electrode of the transistor T3 is connected to the third node N3, and the gate electrode of the transistor T3 is connected to the first node N1; the source electrode of the transistor T4 is connected to a data voltage input terminal Data, the drain electrode of the transistor T4 is connected to the second node N2, and the gate electrode of the transistor T4 is connected to the writing and compensating control terminal Gate; the source electrode of the transistor T5 is connected to the operation voltage input terminal ELVDD, the drain electrode of the transistor T5 is connected to the second node N2, and the gate electrode of the transistor T5 is connected to the light-emitting control terminal EM; the source electrode of the transistor T6 is connected to the third node N3, the drain electrode of the transistor T6 is connected to a first end of the OLED, the gate electrode is connected to the light-emitting control terminal EM; the source electrode of the transistor T7 is connected to the initial voltage input terminal Ini, the drain electrode of the transistor T7 is connected to the first node N1, and the gate electrode of the transistor T7 is connected to the reset control terminal Reset; one end of the capacitor C1 is connected to a first node N1, and the other end of the capacitor C1 is connected to the operation voltage input terminal ELVDD; the cathode of the OLED is connected to the DC low voltage input terminal ELVSS. It should be appreciated to one of ordinary skill in the art that the reset control terminals Reset (i.e., one reset control terminal Reset connected directly to the transistor T1 and the other reset control terminal Reset connected directly to the transistor T7), as shown in FIG. 2, represent one same reset control terminal. In other words, both the transistor T1 and the transistor T7 in FIG. 2 are connected directly to the same reset control terminal Reset. For example, FIG. 2 illustrates this connection by using the same symbol Reset.

Figure 3:
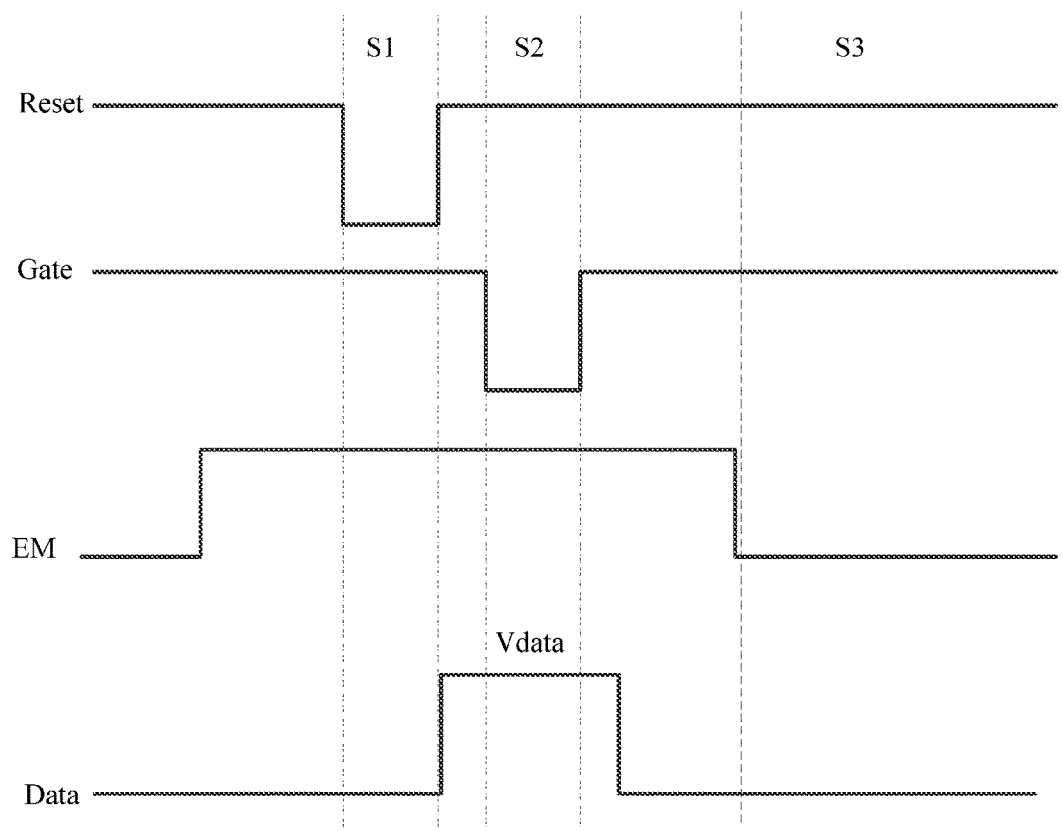
FIG. 3 is a timing diagram of necessary signals in a method for driving the pixel circuit as shown in FIG. 2.
Figure 4:
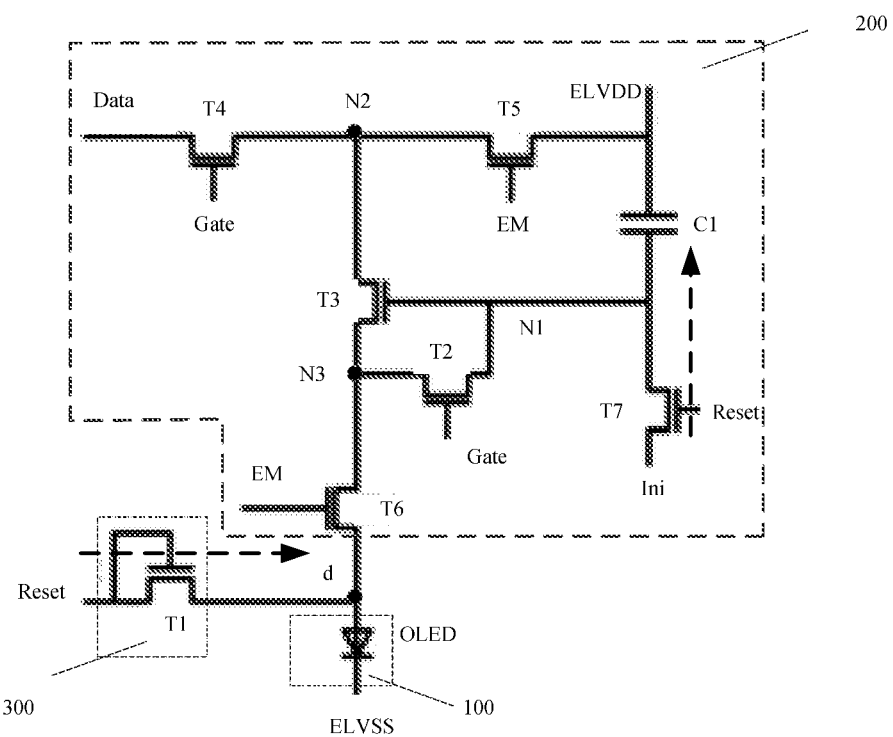
FIG. 4, FIG. 5, and FIG. 6 are flowing-direction diagrams of currents of the pixel circuit in FIG. 2 in different stages.
Figure 5:
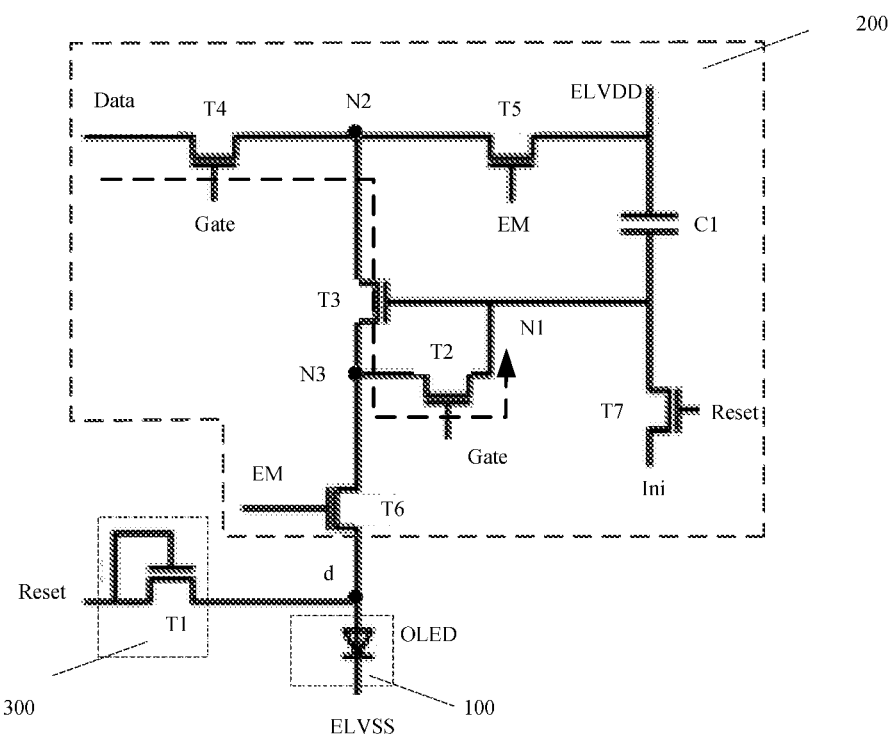
Figure 6:
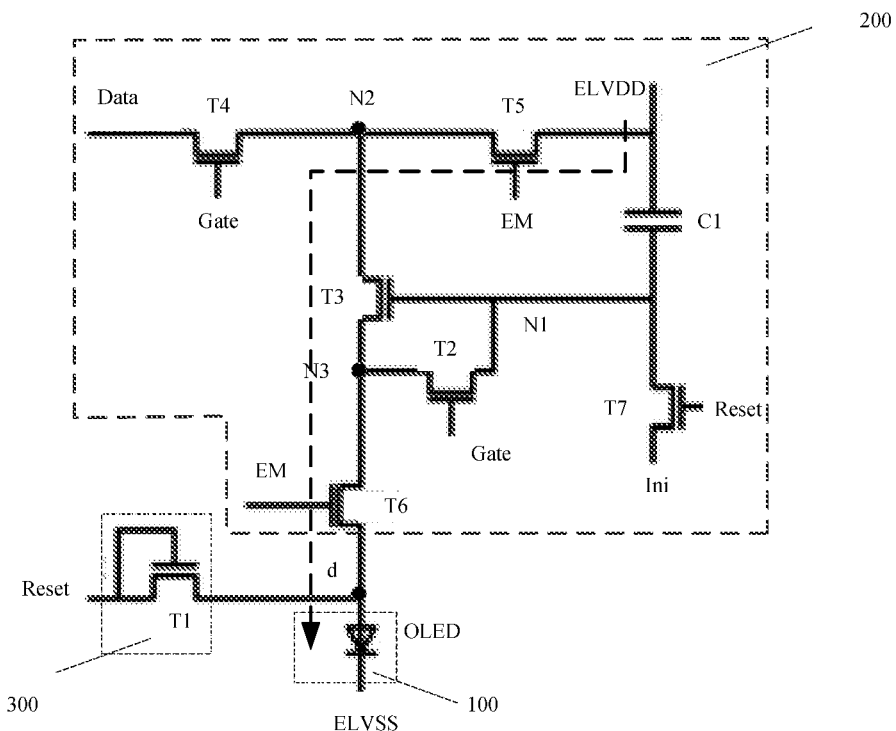

The display substrate of the pixel circuit as shown in FIG. 2 can be driven by means of FIG. 3-FIG. 6, wherein FIG. 3 shows a timing diagram of control signals applied to various output terminals in a process of display driving. The whole display driving process can be divided into three stages, i.e., S1, S2, and S3; FIG. 4, FIG. 5, and FIG. 6 are flowing-direction diagrams of currents in the pixel circuit in the three stages, respectively. In the whole display driving process, the DC low voltage Vss (which is generally about −5.4V) inputted at the DC low voltage input terminal ELVSS, the operation voltage Vdd input at the operation voltage input terminal ELVDD, the initial voltage Vin (which is generally about −3V) inputted at the initial voltage input terminal Ini are all DC voltages, the levels of these voltages do not change with time, and are not shown in FIG. 3.

At the first stage S1, referring to FIG. 3 and FIG. 4, the reset control signals having low voltage levels applied to the reset control terminals Reset cause the transistors T1 and T7 to be turned on, and high voltage levels are applied to the writing and compensating control terminals Gate and the light-emitting control terminals EM so that the transistors T2, T4, T5, T6 are turned off. The turning off transistors T4, T5 and T6 in turn cause the transistor T3 to be turned off. Because the transistor T7 is turned on, the first node N1 is connected with the initial voltage input terminal Ini, and thus, the voltage at the first node N1 is set as the initial voltage Vin. The voltage of the reset control signal inputted in this embodiment may be lower than the DC low voltage Vss, so that the voltage of the cathode of the OLED is higher than the voltage of the anode of the OLED, thereby implementing the reverse offset of the electroluminescent unit. Further, the voltage of the reset control signal can be a voltage (such as about −7V) lower than the initial voltage Vin (i.e., the absolute value of the voltage of the reset control signal is larger than that of the initial voltage Vin) so as to offset the OLED in a better manner. From the above, it can be seen that a process of reversely offsetting the OLED is implemented in this stage. The first stage S1 corresponds to the above reverse offset stage.

In the second stage S2, referring to FIG. 3 and FIG. 5, the low voltage levels applied to the writing and compensating control terminals Gate cause the transistors T4 and T2 to be turned on, and a corresponding data voltage Vdata is applied to the data voltage input terminal Data. At this time, the first node N1 is charged through the transistor T3 by the data voltage input terminal Data until the voltage at the first node N1 reaches Vdata+Vth, wherein Vth is a threshold voltage of the transistor T3 which is negative herein. High voltage levels are applied to the reset control terminal Reset and the light-emitting control terminal EM, such that the transistors T1, T5, T6 and T7 are all turned off. In this stage, data voltage input and voltage compensation are implemented.

In the third stage S3, referring to FIG. 3 and FIG. 6, the light-emitting control signals having high voltage levels applied to the writing and compensating control terminals Gate and the reset control terminals Reset cause the transistors T1, T2, T4 and T7 to be turned off, and the low voltage levels applied to the light-emitting control terminals EM causes the transistors T5 and T6 to be turned on. At this time, the OLED is connected to the operation voltage input terminal ELVDD through the transistors T6, T3, T5, and emits light according to the operation voltage Vdd. A current flowing through the OLED is $I=K(Vdata+Vth-Vdd-Vth)^2=K(Vdata-Vdd)^2$. It can be seen that a current flowing through the OLED is not affected by a threshold of the transistor T3. The pixel circuit provided in the embodiment of the present disclosure can effectively avoid the influence to light emission caused by threshold drifting of the transistor T3.

It can be understood that, although the embodiments of the present disclosure are exemplified by the P-type transistor T1 of the offset control unit, the offset control unit herein may be implemented by using other structures in actual applications. In addition, the offset control unit is not necessarily configured to be turned on under low voltage levels in practice, but can be configured to be turned on under high voltage levels as desired by actual reverse offset processes, and the first end of the electroluminescent unit is set to a relatively high voltage.

It can be understood that, although the embodiments of the present disclosure are exemplified by the display driving unit including the transistors T2, T3, T4, T5, T6 and the capacitor C1, the display driving unit can have other structures in actual applications, and on the premise that display driving can be implemented, a specific structure of the display driving unit would not affect implementation of the present disclosure, and resulting technical solutions fall into the protection scope of the present disclosure.

In the embodiments of the present disclosure, the employed transistors are all P-type transistors, the benefit of which is that the transistors can be fabricated with uniform processes. It can be easily understood that parts of all of the above transistors can be replaced by N-type transistors in actual implementations, and if the transistors T1, T7 are replaced by the N-type transistors, the reset control signals should have high voltage levels, and if the transistors T5 and T6 are replaced by the N-type transistors, the light-emitting control signals should have high voltage levels. Similarly, if the transistors T4 and T2 are replaced by the N-type transistors, a writing and compensation control signal applied to the writing and compensating control terminal may be a pulse of a high voltage level. Further, it can be easily understood that, connection relationships of the source electrodes and connection relationships of the drain electrodes of the above transistors can be interchanged according to actual requirements.

Alternatively, the pixel circuit according to the embodiments of the present disclosure can further include the light-emitting control terminal EM, the display driving unit 200 according to the embodiments of the present disclosure is further connected to the light-emitting control terminal EM, and when a light-emitting control signal is inputted to the light-emitting control terminal, a current having a corresponding amplitude is generated according to the voltage at the first node N1 and is inputted to the first end 'd' of the electroluminescent unit 100.

Figure 7:
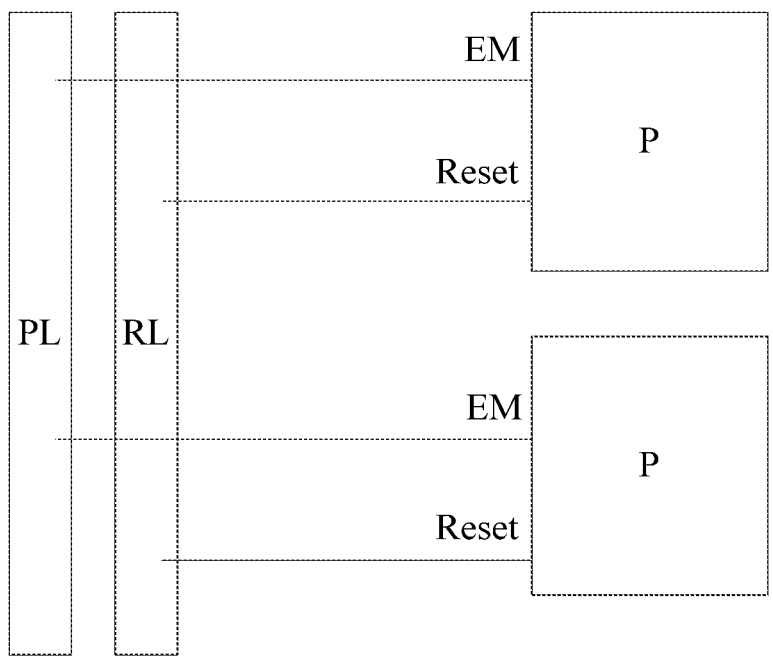
FIG. 7 is a structural schematic diagram of a display substrate according to the embodiments of the present disclosure.

Further, referring to FIG. 7, besides the pixel circuit (which is shown as P in FIG. 7) as shown in FIG. 2, the display substrate according to the embodiments of the present disclosure can further include a first test wire RL and a second test wire PL, wherein the first test wire RL is connected to the reset control terminal Reset of the pixel circuit in each row, and the second test wire PL is connected to the light-emitting control terminal EM in the pixel circuit in each row. The advantage of such arrangement is a lighting test to the pixel circuits can be accomplished by a suitable driving method, without disassembling the display substrate.

Specifically, in a test stage, the above driving method can further include the following steps: applying a light emission driving voltage to the first test wire RL, and applying a voltage signal having a reverse level compared to the level of the light-emitting control signal to the second test wire PL, wherein the light emission driving voltage is adapted to turn on the offset control unit 300 in each pixel circuit, and causes the light-emitting unit of each pixel circuit to emit light.

Because a high voltage level is applied to the second test wire PL, the transistors T5 and T6 are turned off, causing the OLED to be not affected by the display driving unit and to be only related with the light emission driving voltage applied to the first test wire RL. In this way, a tester can determine a faulty pixel circuit by finding which pixel circuit has abnormal display brightness.

In actual implementations, the light emission driving voltage applied to the first test wire RL can be a voltage having a level higher than that of the DC low voltage Vss and lower than that of a threshold voltage of the transistor T1, such that the transistor T1 in each pixel circuit is turned on and the OLED can emit light.

In actual implementations, in order to avoid affecting lighting, in a display stage, the light emission driving voltage may not be applied to the first test wire RL, and a test control signal may not be applied to the second test wire PL.

It can be easily understood that, in specific implementations, although FIG. 7 is exemplified by means of assuming the pixel circuit P as the pixel circuit of FIG. 2, the pixel circuit in FIG. 7 can be different from that shown in FIG. 2 in actual applications. So long as the pixel circuit in FIG. 7 is the one as described in the first aspect and the display driving unit controls the current inputted to the first end of the OLED according to the voltage at the first node only when the light-emitting control signal is inputted at the light-emitting control terminal, a voltage having a reverse level compared with that of the test control signal can be applied to the second test wire at the test stage, and the display driving unit is caused not to input a corresponding current to the electroluminescent unit, so as to avoid influencing a test procedure.

Figure 8:
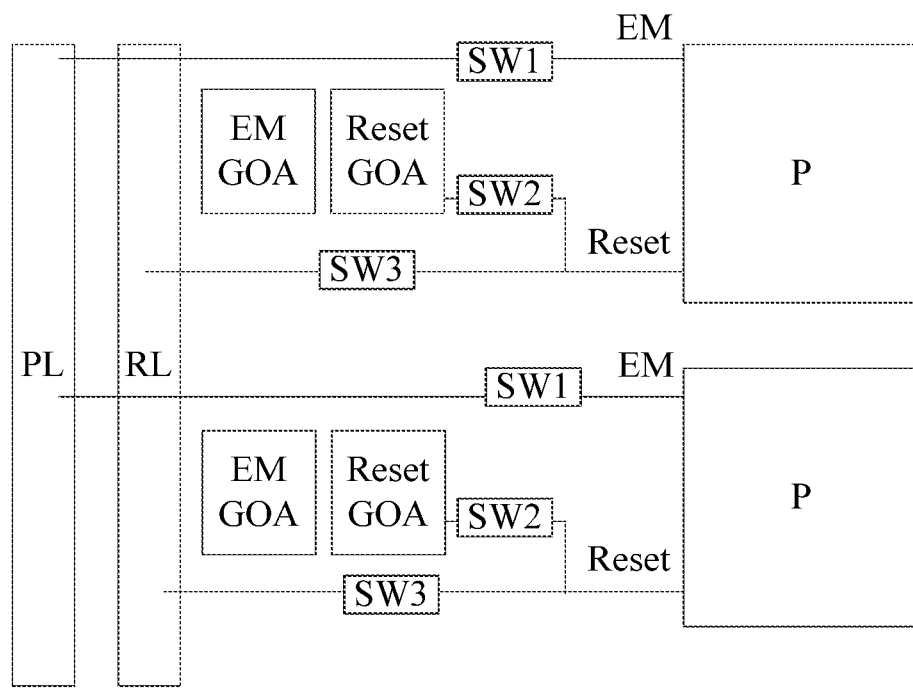
FIG. 8 is a structural schematic diagram of another display substrate according to the embodiments of the present disclosure.

In addition, the present disclosure also provides another type of display substrate which can be an alternative to the display substrate shown in FIG. 7. Referring to FIG. 8, besides the first test wire RL and the second test wire PL, the display substrate shown in FIG. 8 further includes first scan driving circuits Reset GOA, second scan driving circuits EM GOA, a test switch array, and a plurality of test control wires (not shown) for controlling the test switch array; wherein the first scan driving circuit Reset GOA is adapted to output the reset control signal to the reset control terminal Reset of each pixel circuit row by row, and the second scan driving circuit EM GOA is adapted to output the light-emitting control signal to the light-emitting control terminal EM of each pixel circuit row by row; the test switch array includes a plurality of first test switches SW1, a plurality of second test switches SW2, and a plurality of third test switches SW3; the first test wire RL and the second test wire PL in this display substrate are not connected to the pixel circuits directly, but connected to the test switch array.

The pixel circuits in each row correspond to a first test switch SW1, a second test switch SW2 and a third test switch SW3; the first test switch SW1 is connected between the light-emitting control terminals EM of the pixel circuits in each row and the second test wire PL, the second test switch SW2 is connected between the first scan driving circuit Reset GOA and the reset control terminals Reset in the pixel circuits in the row, and the third test switch SW3 is connected between the reset control terminals Reset in the pixel circuits in the row and the first test wire RL.

A procedure for testing the display substrate shown in FIG. 8 can also be accomplished without disassembly. Specifically, the above driving method can further include the following steps: in the display stage, applying a corresponding display control signal to each test control wire, turning the switches SW1 and SW3 off and turning the switch SW2 on, so that the reset control terminal Reset in each pixel circuit and the first test wire RL are disconnected and the light-emitting control terminal EM in each pixel circuit and the second test wire PL are disconnected, and the reset control terminal Reset in each pixel circuit is connected to the first scan driving circuit Reset GOA; and in the test stage, applying a corresponding test control signals to each test control wire, turning the switches SW1 and SW3 on and turning the switch SW2 off so that the reset control terminal Reset in each pixel circuit and the first test wire RL are connected and the light-emitting control terminal EM in each pixel circuit and the second test wire PL are connected, and the reset control terminal Reset in each pixel circuit is disconnected from the first scan driving circuit Reset GOA, applying a voltage signal having a reverse level compared to the voltage level of the light-emitting control signal to the second test wire PL, so that the display driving units in the pixel circuits in each row cannot generate the corresponding currents, and applying the light emission driving voltage to the first test wire RL, the light emission driving voltage being adapted to turning each offset control unit 300 on and cause a light-emitting unit of each corresponding pixel circuit to emit light.

In this way, in the display stage, each pixel circuit is normally connected with the scan driving circuit Reset GOA and the scan driving circuit EM GOA, so that normal displaying can be accomplished. In the test stage, the pixel circuit is disconnected from the scan driving circuit Reset GOA, and is connected with the first test wire RL and the second test wire PL, so that the corresponding test procedure can be accomplished.

It can be easily understood that, although FIG. 8 is exemplified by the test switch array including the first switch SW1, the second switch SW2 and the third SW3, this test switch array can have other structures in actual application. Under the premise that such function as "according to the corresponding display control signal applied to each test control wire, disconnecting the reset control terminal in each pixel circuit from the first test wire RL and disconnecting the light-emitting control terminal in each pixel circuit from the second test wire PL, connecting the reset control terminal Reset in each pixel circuit to the first scan driving circuit Reset GOA; and according to the corresponding test control signal applied to each test control wire, connecting the reset control terminal in each pixel circuit and the first test wire RL and connecting the light-emitting control terminal in each pixel circuit and the second test wire PL, and disconnecting the reset control terminal Reset in each pixel circuit from the first scan driving circuit Reset GOA" can be achieved, what specific structure used by the test switch array would not affect "testing the pixel circuits without disassembly" and thus the resulting technical solutions also should fall into the protection scope of the present disclosure.

In a further aspect, the present disclosure also provides a display device including the above mentioned display substrate. In implementations, the display device herein can be any product or component with a capability of displaying, such as an electronic paper, a mobile phone, a tablet computer, a television, a monitor, a laptop computer, a digital photo frame, a navigating device and so on.

Although the embodiments of the present disclosure are described with respect to the drawings, a person skilled in the art may make various modifications and variations to these embodiments without departing from the spirit and scope of the present disclosure. Such modifications and variations fall into the scope as defined by the attached claims.

What is claimed is:

1. A pixel circuit, comprising: an electroluminescent unit, a display driving unit, an offset control unit, a reset control terminal and an initial voltage input terminal, wherein
the display driving unit is connected to the reset control terminal, the initial voltage input terminal, a first node, and a first end of the electroluminescent unit, and configured to generate a current having a corresponding amplitude according to a voltage at the first node, input the current to the first end of the electroluminescent unit, and set a voltage at the first node to be an initial voltage inputted at the initial voltage input terminal in response to a reset control signal inputted at the reset control terminal; and
the offset control unit is connected to the reset control terminal and the first end of the electroluminescent unit, and configured to be turned on in the case that the reset control signal is inputted at the reset control terminal, so as to set the voltage at the first end of the electroluminescent unit to be a voltage of the reset control signal.

2. The pixel circuit according to claim 1, wherein the offset control unit is configured to be turned on in the case that the reset control terminal is at a low voltage level, and the current generated by the display driving unit is a positive current.

3. The pixel circuit according to claim 2, wherein the offset control unit comprises a first transistor of a P-type, one of a source electrode and a drain electrode of the first transistor is connected to the first end of the electroluminescent unit, a gate electrode and the other one of the source electrode and the drain electrode of the first transistor are connected to the reset control terminal.

4. The pixel circuit according to claim 1, further comprising a light-emitting control terminal, wherein the display driving unit is further connected to the light-emitting control terminal, and configured to generate the current having the corresponding amplitude according to the voltage at the first node and input the current to the first end of the electroluminescent unit in the case that a light-emitting control signal is inputted to the light-emitting control terminal.

5. The pixel circuit according to claim 4, further comprising: a data voltage input terminal, an operation voltage input terminal, a direct-current low voltage input terminal, and a writing and compensating control terminal;
the display driving unit comprises a second transistor, a third transistor, a fourth transistor, a fifth transistor, a sixth transistor, and a seven transistor which are all of the P-type, and comprises a capacitor;
a gate electrode of the second transistor is connected to the writing and compensating control terminal, one of a source electrode and a drain electrode of the second transistor is connected to the first node, and the other one of the source electrode and the drain electrode of the second transistor is connected to a third node;
a gate electrode of the third transistor is connected to the first node, one of a source electrode and a drain electrode of the third transistor is connected to a second node, and the other one of the source electrode and the drain electrode of the third transistor is connected to the third node;
a gate electrode of the fourth transistor is connected to the writing and compensating control terminal, one of a source electrode and a drain electrode of the fourth transistor is connected to the data voltage input terminal, and the other one of the source electrode and the drain electrode of the fourth transistor is connected to the second node;
both a gate electrode of the fifth transistor and a gate electrode of the sixth transistor are connected to the light-emitting control terminal, one of a source electrode and a drain electrode of the fifth transistor is connected to the operation voltage input terminal, and the other one of the source electrode and the drain electrode of the fifth transistor is connected to the second node, one of a source electrode and a drain electrode of the sixth transistor is connected to the first end of the electroluminescent unit, and the other one of the source electrode and the drain electrode of the sixth transistor is connected to the third node;
a gate electrode of the seventh transistor is connected to the reset control terminal, one of a source electrode and a drain electrode of the seventh transistor is connected to the initial voltage input terminal, and the other one of the source electrode and the drain electrode of the seventh transistor is connected to the first node;
one end of the capacitor is connected to the first node, and the other end of the capacitor is connected to the operation voltage input terminal; and
the light-emitting control signal is of a low voltage level.

6. A display substrate, comprising:
a base; and
a plurality of pixel circuits arranged on the base, wherein each of the plurality of pixel circuits is the pixel circuit according to claim 4, and the display substrate further comprises a first test wire and a second test wire, the first test wire is connected to the reset control terminals of the pixel circuits in each row, and the second test wire is connected to the light-emitting control terminals of the pixel circuits in each row.

7. The display substrate according to claim 6, wherein each of the pixel circuits further comprises: a data voltage input terminal, an operation voltage input terminal, a direct-current low voltage input terminal, and a writing and compensating control terminal;
the display driving unit comprises a second transistor, a third transistor, a fourth transistor, a fifth transistor, a sixth transistor, and a seven transistor which are all of the P-type, and comprises a capacitor;
a gate electrode of the second transistor is connected to the writing and compensating control terminal, one of a source electrode and a drain electrode of the second transistor is connected to the first node, and the other one of the source electrode and the drain electrode of the second transistor is connected to a third node;
a gate electrode of the third transistor is connected to the first node, one of a source electrode and a drain electrode of the third transistor is connected to a second node, and the other one of the source electrode and the drain electrode of the third transistor is connected to the third node;

a gate electrode of the fourth transistor is connected to the writing and compensating control terminal, one of a source electrode and a drain electrode of the fourth transistor is connected to the data voltage input terminal, and the other one of the source electrode and the drain electrode of the fourth transistor is connected to the second node;

both a gate electrode of the fifth transistor and a gate electrode of the sixth transistor are connected to the light-emitting control terminal, one of a source electrode and a drain electrode of the fifth transistor is connected to the operation voltage input terminal, and the other one of the source electrode and the drain electrode of the fifth transistor is connected to the second node, one of a source electrode and a drain electrode of the sixth transistor is connected to the first end of the electroluminescent unit, and the other one of the source electrode and the drain electrode of the sixth transistor is connected to the third node;

a gate electrode of the seventh transistor is connected to the reset control terminal, one of a source electrode and a drain electrode of the seventh transistor is connected to the initial voltage input terminal, and the other one of the source electrode and the drain electrode of the seventh transistor is connected to the first node;

one end of the capacitor is connected to the first node, and the other end of the capacitor is connected to the operation voltage input terminal; and the light-emitting control signal is of a low voltage level.

8. A display device comprising the display substrate according to claim 7.

9. The display substrate according to claim 6, further comprising a first scan driving circuit, a second scan driving circuit, a first test wire, a second test wire, a test switch array, and a plurality of test control wires configured for controlling the test switch array, wherein the first scan driving circuit is configured to progressively output a reset control signal to the reset control terminals of the pixel circuits row by row, and the second scan driving circuit is configured to progressively output the light-emitting control signals to the light-emitting control terminals of the pixel circuits row by row;

the test switch array is connected to the first test wire, the second test wire and the plurality of test control wires, and configured to, at a display stage, in response to display control signals applied to the plurality of test control wires, disconnect the reset control terminal of each of the pixel circuits from the first test wire, disconnect the light-emitting control terminal of each of the pixel circuits from the second test wire, and connect the reset control terminal of each of the pixel circuits to the first scan driving circuit, and to, at a test stage, in response to a test control signal applied to the plurality of test control wires, connect the reset control terminal of each of the pixel circuits to the first test wire, connect the light-emitting control terminal of each of the pixel circuits to the second test wire, and disconnect the reset control terminal of each of the pixel circuits from the first scan driving circuit.

10. The display substrate according to claim 9, wherein each of the plurality of the pixel circuits further comprises: a data voltage input terminal, an operation voltage input terminal, a direct-current low voltage input terminal, and a writing and compensating control terminal;

the display driving unit comprises a second transistor, a third transistor, a fourth transistor, a fifth transistor, a sixth transistor, and a seven transistor which are all of the P-type, and comprises a capacitor;

a gate electrode of the second transistor is connected to the writing and compensating control terminal, one of a source electrode and a drain electrode of the second transistor is connected to the first node, and the other one of the source electrode and the drain electrode of the second transistor is connected to a third node;

a gate electrode of the third transistor is connected to the first node, one of a source electrode and a drain electrode of the third transistor is connected to a second node, and the other one of the source electrode and the drain electrode of the third transistor is connected to the third node;

a gate electrode of the fourth transistor is connected to the writing and compensating control terminal, one of a source electrode and a drain electrode of the fourth transistor is connected to the data voltage input terminal, and the other one of the source electrode and the drain electrode of the fourth transistor is connected to the second node;

both a gate electrode of the fifth transistor and a gate electrode of the sixth transistor are connected to the light-emitting control terminal, one of a source electrode and a drain electrode of the fifth transistor is connected to the operation voltage input terminal, and the other one of the source electrode and the drain electrode of the fifth transistor is connected to the second node, one of a source electrode and a drain electrode of the sixth transistor is connected to the first end of the electroluminescent unit, and the other one of the source electrode and the drain electrode of the sixth transistor is connected to the third node;

a gate electrode of the seventh transistor is connected to the reset control terminal, one of a source electrode and a drain electrode of the seventh transistor is connected to the initial voltage input terminal, and the other one of the source electrode and the drain electrode of the seventh transistor is connected to the first node;

one end of the capacitor is connected to the first node, and the other end of the capacitor is connected to the operation voltage input terminal; and the light-emitting control signal is of a low voltage level.

11. The display substrate according to claim 10, wherein the test switch array comprises a plurality of first test switches, a plurality of second test switches, and a plurality of third test switches;

the pixel circuits in each row correspond to one of the plurality of the first test switches, one of the plurality of the second test switches, and one of the plurality of the third test switches; and the one of the plurality of the first test switches is connected between the light-emitting control terminals of the pixel circuits in the row and the second test wire, the one of the plurality of the second test switches is connected between the reset control terminals of the pixel circuits in the row and the first scan driving circuit, and the one of the plurality of the third test switches is connected between the reset control terminals of the pixel circuits in the row and the first test wire.

12. The display substrate according to claim 9, wherein the test switch array comprises a plurality of first test switches, a plurality of second test switches, and a plurality of third test switches;

the pixel circuits in each row correspond to one of the plurality of the first test switches, one of the plurality of the second test switches, and one of the plurality of the third test switches; and the one of the plurality of the first test switches is connected between the light-emitting control terminals of the pixel circuits in the row and the second test wire, the one of the plurality of the second test switches is connected between the reset control terminals of the pixel circuits in the row and the first scan driving circuit, and the one of the plurality of the third test switches is connected between the reset control terminals of the pixel circuits in the row and the first test wire.

13. A method for driving the display substrate according to claim 9, comprising:
   at a reverse offset stage included in a display stage, progressively outputting a reset control signal to the reset control terminals of the pixel circuits row by row, wherein an absolute value of a voltage of the reset control signal is greater than an absolute value of the initial voltage applied at the initial voltage input terminal;
   at the display stage, applying the display control signals to the plurality of test control wires;
   at the test stage, applying the test control signals to the plurality of test control wires, applying a light emission driving voltage to the first test wire, and applying a voltage having a level reverse to a level of the light-emitting control signal to the second test wire, wherein the light emission driving voltage is adapted to turn on offset control units and enable the pixel circuits to emit light.

14. The method according to claim 13, wherein the test switch array comprises a plurality of first test switches, a plurality of second test switches, and a plurality of third test switches;
   the pixel circuits in each row correspond to one of the plurality of the first test switches, one of the plurality of the second test switches, and one of the plurality of the third test switches; and
   the one of the plurality of the first test switches is connected between the light-emitting control terminals of the pixel circuits in the row and the second test wire, the one of the plurality of the second test switches is connected between the reset control terminals of the pixel circuits in the row and the first scan driving circuit, and the one of the plurality of the third test switches is connected between the reset control terminals of the pixel circuits in the row and the first test wire.

15. A method for driving the display substrate according to claim 6, comprising:
   at a reverse offset stage included in a display stage, progressively outputting a reset control signal to the reset control terminals of the pixel circuits row by row, wherein an absolute value of a voltage of the reset control signal is greater than an absolute value of the initial voltage applied at the initial voltage input terminal; and
   at a test stage, applying a light emission driving voltage to the first test wire, and applying a voltage having a level reverse to a level of the light-emitting control signal to the second test wire.

16. A display device, comprising the display substrate according to claim 6.

17. The display device according to claim 16, wherein each of the plurality of pixel circuits further comprises: a data voltage input terminal, an operation voltage input terminal, a direct-current low voltage input terminal, and a writing and compensating control terminal;
   the display driving unit comprises a second transistor, a third transistor, a fourth transistor, a fifth transistor, a sixth transistor, and a seven transistor which are all of the P-type, and comprises a capacitor;
   a gate electrode of the second transistor is connected to the writing and compensating control terminal, one of a source electrode and a drain electrode of the second transistor is connected to the first node, and the other one of the source electrode and the drain electrode of the second transistor is connected to a third node;
   a gate electrode of the third transistor is connected to the first node, one of a source electrode and a drain electrode of the third transistor is connected to a second node, and the other one of the source electrode and the drain electrode of the third transistor is connected to the third node;
   a gate electrode of the fourth transistor is connected to the writing and compensating control terminal, one of a source electrode and a drain electrode of the fourth transistor is connected to the data voltage input terminal, and the other one of the source electrode and the drain electrode of the fourth transistor is connected to the second node;
   both a gate electrode of the fifth transistor and a gate electrode of the sixth transistor are connected to the light-emitting control terminal, one of a source electrode and a drain electrode of the fifth transistor is connected to the operation voltage input terminal, and the other one of the source electrode and the drain electrode of the fifth transistor is connected to the second node, one of a source electrode and a drain electrode of the sixth transistor is connected to the first end of the electroluminescent unit, and the other one of the source electrode and the drain electrode of the sixth transistor is connected to the third node;
   a gate electrode of the seventh transistor is connected to the reset control terminal, one of a source electrode and a drain electrode of the seventh transistor is connected to the initial voltage input terminal, and the other one of the source electrode and the drain electrode of the seventh transistor is connected to the first node;
   one end of the capacitor is connected to the first node, and the other end of the capacitor is connected to the operation voltage input terminal; and
   the light-emitting control signal is of a low voltage level.

18. A display substrate, comprising:
   a base; and
   a plurality of pixel circuits arranged on the base, wherein each of the plurality of pixel circuits is the pixel circuit according to claim 1.

19. A method for driving the display substrate according to claim 18, comprising:
   at a reverse offset stage included in a display stage, progressively outputting a reset control signal to the reset control terminals of the pixel circuits row by row, wherein an absolute value of a voltage of the reset control signal is greater than an absolute value of the initial voltage applied at the initial voltage input terminal.

20. A display device, comprising the display substrate according to claim 18.

* * * * *

UNITED STATES PATENT AND TRADEMARK OFFICE
CERTIFICATE OF CORRECTION

Page 1 of 1

PATENT NO. : 10,204,974 B2
APPLICATION NO. : 15/233443
DATED : February 12, 2019
INVENTOR(S) : Qiang Wang et al.

It is certified that error appears in the above-identified patent and that said Letters Patent is hereby corrected as shown below:

On the Title Page

Item (73), The Assignees should be listed as:
BOE TECHNOLOGY GROUP CO., LTD.          Beijing, China
ORDOS YUANSHENG OPTOELECTRONICS CO., LTD.   Ordos, China Signed and Sealed this
Seventh Day of July, 2020

Andrei Iancu
*Director of the United States Patent and Trademark Office*